United States Patent
Gülzow et al.

(10) Patent No.: US 8,749,259 B2
(45) Date of Patent: Jun. 10, 2014

(54) FULL GRID CASSETTE FOR A PARALLEL TESTER FOR TESTING A NON-COMPONENTED PRINTED CIRCUIT BOARD, SPRING CONTACT PIN FOR SUCH A FULL GRID CASSETTE AND ADAPTER FOR A PARALLEL TESTER FOR TESTING A NON-COMPONENTED PRINTED CIRCUIT BOARD

(75) Inventors: Andreas Gülzow, Springe (DE); Rüdiger Dehmel, Wunstorf (DE)

(73) Assignee: DTG International GmbH, Zurich (CH)

( * ) Notice: Subject to any disclaimer, the term of this patent is extended or adjusted under 35 U.S.C. 154(b) by 831 days.

(21) Appl. No.: 12/681,295

(22) PCT Filed: Sep. 29, 2008

(86) PCT No.: PCT/EP2008/063038
§ 371 (c)(1),
(2), (4) Date: Jul. 2, 2010

(87) PCT Pub. No.: WO2009/047160
PCT Pub. Date: Apr. 16, 2009

(65) Prior Publication Data
US 2010/0283498 A1    Nov. 11, 2010

(30) Foreign Application Priority Data
Oct. 2, 2007  (DE) .......................... 10 2007 047 269

(51) Int. Cl.
*G01R 31/20*  (2006.01)

(52) U.S. Cl.
USPC ..................................... 324/754.01

(58) Field of Classification Search
CPC ...... G01R 31/28; G01R 31/2808; G01R 1/073
USPC ................. 324/762.01–762.1, 754.01–754.3, 324/755.01–755.11
See application file for complete search history.

(56) References Cited

U.S. PATENT DOCUMENTS

| | | | |
|---|---|---|---|
| 5,493,230 | A | 2/1996 | Swart et al. |
| 6,066,967 | A | 5/2000 | Cahill et al. |
| 6,292,004 | B1 | 9/2001 | Kocher |
| 6,340,893 | B1 | 1/2002 | Prokopp |

(Continued)

FOREIGN PATENT DOCUMENTS

| | | |
|---|---|---|
| DE | 196 44 725 C1 | 4/1998 |
| DE | 199 00 833 A1 | 10/1999 |

(Continued)

OTHER PUBLICATIONS

International Search Report, dated May 15, 2009, corresponding to PCT/EP2008/063038.

(Continued)

*Primary Examiner* — Tung X Nguyen
(74) *Attorney, Agent, or Firm* — Christie, Parker & Hale, LLP

(57) ABSTRACT

The invention relates to a full grid cassette for a parallel tester for testing a non-componented printed circuit board, to a spring contact pin for such a full grid cassette and to an adapter for a parallel tester for testing a non-componented printed circuit board.

32 Claims, 6 Drawing Sheets

(56) References Cited

U.S. PATENT DOCUMENTS

| | | | |
|---|---|---|---|
| 6,469,531 B1 * | 10/2002 | Sayre et al. | 324/750.25 |
| 6,724,207 B1 | 4/2004 | Chen | |
| 6,900,651 B1 * | 5/2005 | Kazama | 324/754.14 |
| 2005/0110504 A1 | 5/2005 | Doyle et al. | |
| 2009/0251161 A1 | 10/2009 | Guelzow et al. | |

FOREIGN PATENT DOCUMENTS

| | | |
|---|---|---|
| DE | 199 00 833 B4 | 5/2007 |
| DE | 10 2006 059 429 A1 | 6/2008 |
| EP | 0 149 776 B1 | 7/1985 |
| EP | 0 206 704 B1 | 12/1986 |
| FR | 2 887 034 A1 | 12/2006 |
| JP | 10-227826 | 8/1998 |
| KR | 1998-064499 | 10/1998 |
| KR | 10-2005-0103595 | 11/2005 |
| KR | 20-421209 | 7/2006 |
| WO | WO 01/57541 A1 | 8/2001 |

OTHER PUBLICATIONS

German Search Report, dated May 20, 2008, corresponding to DE 10 2007 047 269.4.

Notice of Allowance for Korean Patent Application No. 10-2010-7009711 with English translation, issue date Oct. 25, 2012, 3 pages.

* cited by examiner

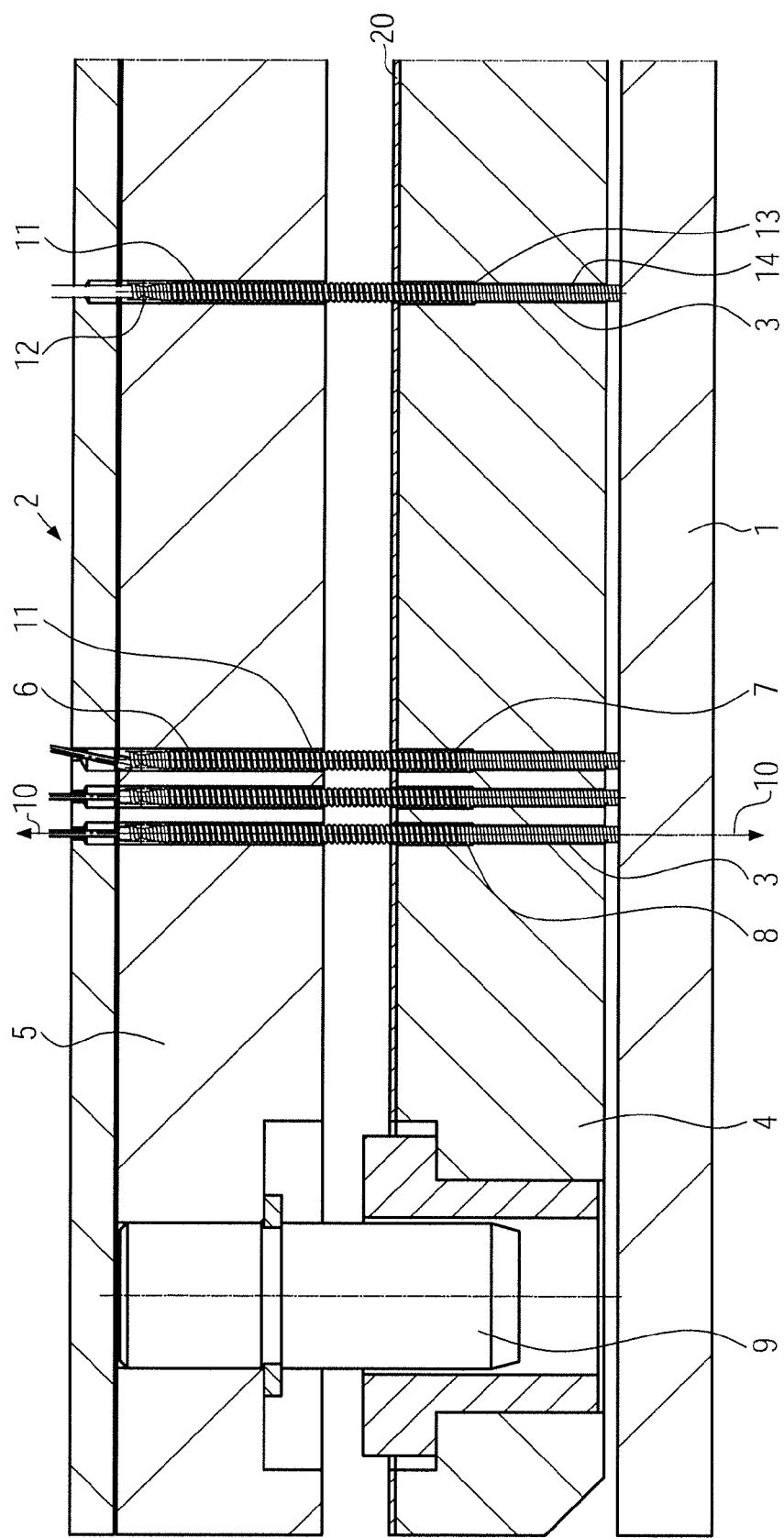

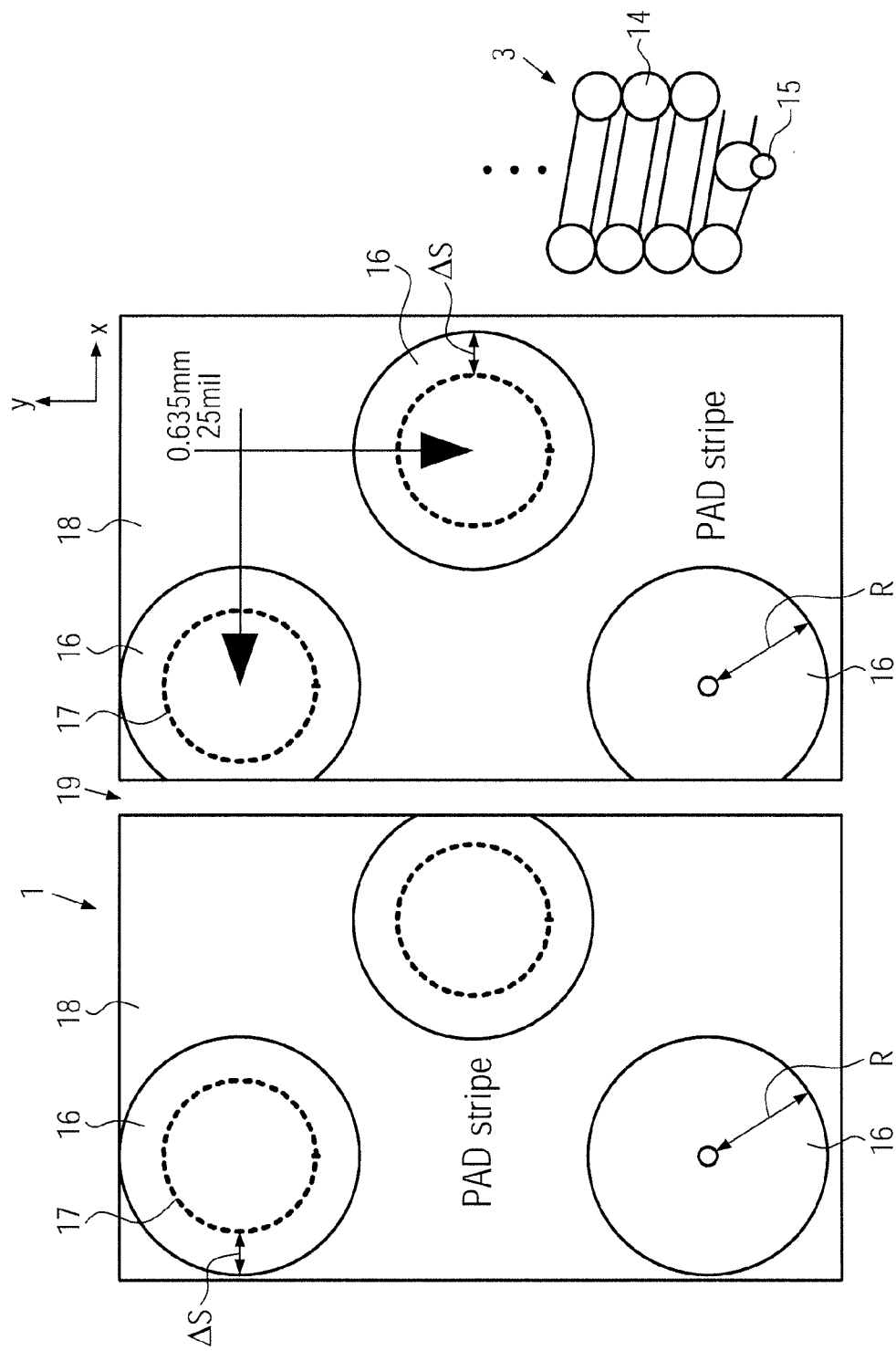

FULL GRID CASSETTE FOR A PARALLEL TESTER FOR TESTING A NON-COMPONENTED PRINTED CIRCUIT BOARD, SPRING CONTACT PIN FOR SUCH A FULL GRID CASSETTE AND ADAPTER FOR A PARALLEL TESTER FOR TESTING A NON-COMPONENTED PRINTED CIRCUIT BOARD

CROSS-REFERENCE TO RELATED APPLICATION

This application is a National Phase Patent Application and claims the priority of International Application Number PCT/EP2008/063038, filed on Sep. 29, 2008, which claims priority of German Patent Application Number 10 2007 047 269.4, filed on Oct. 2, 2007.

The invention relates to a full grid cassette for a parallel tester for testing a non-componented printed circuit board, to a spring contact pin for such a full grid cassette and to an adapter for a parallel tester for testing a non-componented printed circuit board.

Apparatus for testing printed circuit boards is divided into two groups, these being finger testers, which serially scan test points of a printed circuit board to be tested using a plurality of contact fingers, and parallel testers, which simultaneously contact all test points of a printed circuit board to be tested by means of an adapter. Such adapters are also known as grid pattern adapters, because they convert a preset regular basic grid of the test apparatus to the usually irregular arrangement of the test points of a printed circuit board to be tested. An adapter of this type as a rule comprises a plurality of spaced guide plates with guide holes designed to accommodate test needles. The test needles may inclined in the adapter, enabling them to establish an electrical connection between the contact points of the regular basic grid and the printed circuit board test points, which as a rule deviate from the regular arrangement of the basic grid.

As a rule, the adapter is not located directly on the basic grid, but a so-called full grid cassette is provided between the basic grid and the adapter. Similar to the adapter, a full grid cassette comprises a plurality of guide plates wherein contact pins matching the pattern of the basic grid are provided. These contact pins are designed as spring contact pins. The reason for using a full grid cassette of this type lies in the fact that such spring contact pins can be installed into the adapter mapping the pattern of the basic grid onto the test points of the printed circuit board to be tested, being too thick to be inclined in the adapter. On the other hand, it is necessary to compensate for variations in height caused by surface irregularities in the printed circuit board to be tested and/or by the inclination of the needles in the adapter by means of the spring contact pins of the full grid cassette.

A full grid cassette of this type may be an integral part of the test apparatus. It may, however, alternatively be designed as a separate component which can be exchangeably located on the basic grid of the test apparatus.

A special adapter has to be produced for each printed circuit board type to be tested. The full grid cassette, on the other hand, is independent of the type of the printed circuit board to be tested.

So-called plain needles can be used in the adapter. These are thin, straight sections of wire with a thickness of 0.1 mm to 0.2 mm. As nearly all testers are nowadays designed for testing both sides of a printed circuit board, the test apparatus requires the provision of adapters both below and above the printed circuit board to be tested. If the needles are not to fall out of the adapter, they have to be secured therein. If using such plain needles, they are secured either by means of a perforated latex film or by means of a nylon fabric. The latex film has to be pre-perforated at the points where the needles pass through it. The perforation of this type of film is very expensive and difficult. Using a fabric is significantly simpler, as the needles can penetrate the fabric between individual threads. This however results in an offset of the needles which can cause major problems as the density of the printed circuit board test points and thus of the needles increases.

From EP 149 776 B1, test needles for an adapter are known which have a spherical head at one end to prevent the sliding of the test needles into the adapter. The adapter described in this publication is however only suitable for apparatus for the single-face testing of printed circuit boards, because the test needles with their spherical heads always have to be on the top side of the adapter and the adapter cannot be turned upside down. This type of test needle was developed further by providing it with a spherical plastic head at a slight distance from the upper end of the needle. As a result, a further perforated plate could be placed on the adapter, thus securing the plastic heads of the needles between this perforated plate and a further guide plate. The needles secured in this way can no longer fall out of the adapter. These plastic heads and the additional retaining plate, however, require a minimum distance between adjacent needles, so that this securing method does not allow for any further increase in the density of the needle arrangement.

German Patent Application DE 10 2006 059 429.0, which has not yet been published, describes a parallel tester for testing non-componented printed circuit boards, the basic grid of which is made up from two interlaced square grids. Each square grid has a grid spacing of 50 mil. The two grids are offset relative to one another in the X- and Y-directions by half a grid spacing (=25 mil) (FIG. 8). Such a grid can be illustrated as a square grid placed at an angle of 45°, the grid spacing of this inclined square grid being approximately 0.89 mm. The density of the contact points of the basic grid as a whole is 124 contact points per square centimeter. As the test points of the printed circuit boards to be tested are arranged in an irregular pattern, there are regions where the density is increased significantly. In an area of e.g. 1 cm×1 cm, this density may reach more than 600 printed circuit board test points.

A very tight spacing of adjacent test needles can be achieved locally with the known adapters. From EP 206 704 B1, test needles for an adapter which have a tapering contact tip at their free ends are known. With these needles, the distances between adjacent contact tips can be reduced to 0.25 mm or less. However, as a result of the securing methods described above (latex film, fabric, plastic heads), it is impossible to arrange a plurality of such tightly spaced test needles in a preset area of e.g. 1 cm×1 cm. There is therefore a great need for a device for contacting a printed circuit board which would allow test needles to be arranged at a density of 600 test needles per $cm^2$ at their ends facing the printed circuit board to be tested.

DE 196 44 725 C1 describes the basic structure of a full grid cassette. In this full grid cassette, full grid pins are installed, each of which comprises an upper and a lower pin section connected to one another by a coil spring in a resilient and electrically conductive manner. The spring has a larger diameter than the pin sections. The holes for the accommodation of the pin sections and the spring are stepped, holding the full grid pins captive in the full grid cassette.

DE 199 00 833 B4 describes a test holder for holding printed circuit boards in a test apparatus. The test holder comprises a support plate on which a probe plate is located. Holes for the accommodation of spring pressure probes are provided both in the support plate 12 and in the probe plate. Between the support plate and the probe plate, a probe retaining film is provided through which the spring pressure probes extend. The film may be made of close-celled rubber, in particular latex rubber.

FR 2 887 034 illustrates the use of a non-sheathed spring contact pin formed from a wire with a helically wound spring section. This spring contact pin is located between a substrate and a soldering point of a printed circuit board. The examiner has cited this document with reference to the independent claim.

The invention is therefore based on the problem of creating a full grid cassette for a parallel tester for testing a non-componented printed circuit board, a spring contact pin for such a full grid cassette and an adapter for a parallel tester for testing a non-componented printed circuit board, which, compared to conventional devices, would allow locally for a higher contact point density and which would moreover be suitable for testing both sides of printed circuit boards.

This problem is solved by a full grid cassette with the feature of claim 1 or 8 respectively, by a spring contact pin with the features of claim 14 and by an adapter with the features of claim 17. Advantageous further developments of the invention are specified in the relevant dependent claims.

According to a first aspect of the present invention, a full grid cassette for an apparatus for testing non-componented printed circuit boards is provided for electrically connecting contact points of a basic grid to individual test needles of a grid pattern adapter. It comprises a basic grid plate oriented towards the basic grid and an adapter plate oriented towards the adapter, wherein aligned through holes are provided to accommodate spring contact pins. Each of the spring contact pins is made from a wire with a helically wound spring section and located without sheathing in the through holes of the adapter plate and the basic grid plate. The spring sections extend at least across the region between the adapter plate and the basic grid plate. A film is provided between the adapter plate and the basic grid plate. The film has holes through each of which one of the spring contact pins passes, the width of the holes being less than the diameter of the spring contact pins in the region of the spring section.

The spring contact pins are installed without sheathing into the through holes of the adapter plate and the basic grid plate. This results in a higher grid density compared to a full grid cassette with contact pins provided with a sleeve. The spring contact pins can therefore have a maximum external diameter of no more than 0.75 mm and can be inserted into holes of a corresponding size. With these small spring contact pins, a grid spacing of 50 mil (=1.27 mm) is obtained at the full grid cassette with two interlaced square grids (FIG. 8). In addition, two such regular square grids can be offset by half a grid spacing, resulting in a spring contact pin density which is twice as high as in a simple square grid.

The spring contact pins are further retained in the adapter by the film provided between the adapter plate and the basic grid plate and secured against falling out. As a result, the adapter can be handled with either side facing upwards without the loss of the spring contact pins. This is particularly useful in the case of an adapter wherein the test needle is only secured against falling out on one side. The existing grid cassette can be placed on such an adapter, thus securing the test needles against falling out on both sides. Either side of such a unit comprising a full grid cassette and an adapter can be arranged to face upwards, and two such units can be installed into a test apparatus for testing both sides of printed circuit boards.

The inventors of the present invention are aware of the fact that it is significantly more difficult to secure the test needles of an adapter by means of a film or fabric in the adapter against falling out at the contact point density required here than it would be to secure the spring contact pins, which are much thicker than the test needles, in the full grid cassette against falling out.

The holes in the films are preferably designed as slots of a length which slightly exceeds the external diameter of the spring contact pins in the region of the spring section and of a width which is slightly less than the external diameter of the spring contact pins in the region of the spring section and/or a thickened point. When the spring contact pins are installed into the full grid cassette, they are pushed through the slots, which give way laterally if a defined pressure is applied to the spring contact pins. When the spring contact pins are located in the full grid cassette, the longitudinal edges of the slots snap into place behind the main thickened point or between the windings of the spring contact pins, thus securing the spring contact pins in the full grid cassette.

A polyimide PI film has proved to be particularly suitable for securing the spring contact pins in the full grid cassette.

According to a second aspect of the invention, a full grid cassette for an apparatus for testing non-componented printed circuit boards is provided for electrically connecting contact points of a basic grid to individual test needles of a grid pattern adapter. The full grid cassette comprises a basic grid plate oriented towards the basic grid and an adapter plate oriented towards the adapter, wherein aligned through holes are provided to accommodate spring contact pins, each of the spring contact pins being made from a wire with a helically wound spring section and located without sheathing in the through holes of the adapter plate and the basic grid plate, and a guide device located between the adapter plate and the basic grid plate such that the adapter plate and the basic grid plate are movable relative to one another in the axial direction of the spring contact pins and have a play in the plane perpendicular to the axial direction of the spring contact pins.

The spring contact pins are installed without sheathing into the through holes of the adapter plate and the basic grid plate. Each is made of a wire and is helically wound at least in a spring section. As a result the spring contact pins develop a spring action in their axial direction. As they are not sheathed by a sleeve or the like, they also have a certain degree of elasticity at right angles to their axial direction.

The adapter plate and the basic grid plate are guided by a guide device such that they are movable relative to one another in the axial direction of the spring contact pins. In addition however, this guide device is designed such that a play is provided at right angles to the axial direction between the adapter plate and the basic grid plate. As a result, the adapter plate and the basic grid plate can also be aligned relative to one another in the transverse direction at right angles to the axial direction of the spring contact pins. As the individual spring contact pins have some elasticity in the transverse direction, they do not impede the displacement of the adapter plate relative to the basic grid plate. These two plates can therefore be aligned independently relative to the basic grid and/or the adapter. At the high contact point density currently demanded both at the basic grid and at the adapter, this play offers an important advantage in a test apparatus, because the adapters in the test apparatus are precisely adjusted relative to a frame of the test apparatus, which may result in faulty contacting at the tolerances commonly used in adapter construction owing to the relatively small contact pads of the basic grid. Owing to the free movement of the basic grid plate relative to the adapter plate within this play, the basic grid plate can be aligned precisely to the corresponding basic grid, and any existing tolerances can be compensated. The play expediently lies within a range of 60 µm to 200 µm, preferably 80 µm to 150 µm.

According to a preferred embodiment, the adapter plate is provided with alignment pins for engagement with the adapter, while the basic grid plate is provided with alignment pins for engagement with the basic grid plate, the alignment pins of the adapter plate being independent of and separate from the alignment pins of the basic grid plate.

According to a third aspect of the present invention, a spring contact pin for a full grid cassette is provided, which is helically wound from a wire and comprises at least one spring section, the maximum diameter of the spring contact pin being no more than 0.8 mm. At one end of the spring contact pin, the end winding of the wire has a smaller radius than the adjacent windings, so that the wire has an end which is centrally located relative to the adjacent windings and forms a central spring contact point.

Such a spring contact pin for a full grid cassette has a minimum length of approximately 15 to 20 mm. The wire has a thickness of approximately 0.12 mm. The minimum diameter to which such spring contact pins are usually wound is approximately 0.6 mm. This means that the minimum winding radius is approximately 0.3 mm. Smaller radii are difficult and require high forces. The spring contact pin according to the invention has a winding section with a radius smaller than that of the adjacent winding at one end. As a result, the end of this winding section is centred relative to the adjacent winding. The bending of this last winding section is a highly complex operation, because in this winding section much higher forces are required to bend the wire than in the other windings. This centrally located contact point of the spring contact pin is used for contacting contact points of the basic grid. Owing to the central disposition of the contact point relative to the spring contact pin, a contact pad on the basic grid is contacted centrally if the spring contact pin is perfectly aligned. With conventional spring contact pins with spring contact points lying outside the centre, a pad array is contacted off centre even if the spring contact pin is perfectly aligned. As a result, the spring contact point of conventional spring contact pins may come to lie outside the contact pad of the basic grid, preventing an electrical contact even at a minor offset of the contact pad of the basic grid relative to the spring contact pin. The centrally disposed spring contact point significantly increases the tolerance band, which in the case of circular contact pads amounts to a full radius of the circular contact pad. These spring contact pins with central spring contact points are particularly useful in basic grids with a high contact point density, as their contact pad is very small and even minor offsets between the spring contact pins and the contact pads of the basic grid may result in faulty contacting.

According to a fourth aspect of the present invention, an adapter for an apparatus for testing non-componented printed circuit boards is provided. The adapter is designed for electrically connecting probes of a full grid cassette to contact points of a printed circuit board to be tested. The adapter comprises a plurality of guide plates in which guide holes are provided through which the contact needles or contact pins pass, wherein the contact pins are designed for contacting plated-through holes of the printed circuit boards to be tested with a probe tip, and wherein each of the contact pins has a locking projection. The guide plate of the adapter which faces the printed circuit board to be tested has a hole which is designed such that the locking projection can pass through from the side of the printed circuit board to be tested, and on the side remote from the printed circuit board to be tested, a locking recess is provided adjacent to the hole to accommodate the locking projection.

According to this aspect of the invention, an adapter is provided for electrically connecting probes of a full grid cassette to contact points of a printed circuit board to be tested. This adapter comprises both contact needles and contact pins. The contact needles are provided for contacting pad arrays on the printed circuit board. The contact needles are thin, straight wire elements with a slight thickening or widening at the end facing the full grid cassette. Such contact needles are known. The widening at an end secures the contact needles against falling out on the side of the adapter which faces the printed circuit board to be tested. The contact pins, on the other hand, have a probe tip substantially wider than the rest of the contact pin on the side facing the printed circuit board to be tested. Plated-through holes of the printed circuit board to be tested can be contacted securely with this probe tip. These contact pins cannot be provided with a thickening at the end facing the full grid cassette to secure them against falling out on the side facing the printed circuit board to be tested. In view of this, it is proposed that these contact pins should be provided with a locking projection and the guide plate of the adapter which faces the printed circuit board to be tested should be provided with a keyhole. Viewed from above, the keyhole is T-shaped with a "cross bar" and an "upright". The cross bar is long enough to enable the contact pin with its locking projection, which is preferably provided on both sides, to pass through the cross bar. The cross bar is further located slightly aside from the ideal position of the contact pin, so that the latter comes to lie in the upright of the T-hole through the guidance of the further guide plates. As a result, the locking projections come to lie on the guide plate with the keyhole and secure the contact pin against falling out. In a further development, a recess may be provided on the guide plate with the keyhole on the side remote from the printed circuit board such that the locking projection is accommodated there and the contact pin is secured against twisting. In this embodiment, the hole through which the contact pin together with its locking projection is passed does not have to be located outside the ideal position of the contact pin. On the side of this guide plate which is remote from the printed circuit board to be tested, a recess accommodating the locking projection is provided adjacent to this hole. This secures the contact pin against twisting, and it comes to lie on this guide plate with its locking projection, whereby it is secured against falling out on the side facing the printed circuit board to be tested as well.

If such an adapter is fitted to a full grid cassette, the contact needles and contact pins of the adapter can no longer fall out on the side of the full grid cassette. On the other hand, the contact needles are secured against falling out on the side of the adapter which is remote from the full grid cassette by their widening, while the contact pins are secured by their locking projections. The unit comprising the adapter and the full grid cassette can therefore be handled with either side facing downwards without losing any contact needles or contact pins.

The invention is explained in greater detail below with reference to the drawings. Of the drawings:

FIG. 2 is a sectional view of a region of the full grid cassette from FIG. 1 together with a section of the adapter;

FIG. 6b is a diagrammatic section of a guide plate with a hole for the accommodation of the contact pin from FIG. 6a;

FIG. 7 is a diagrammatic representation of an end section of a spring contact pin with a central spring contact point; and FIG. 8 is a top view of a section of a basic grid constructed from modules.

Figure 3:
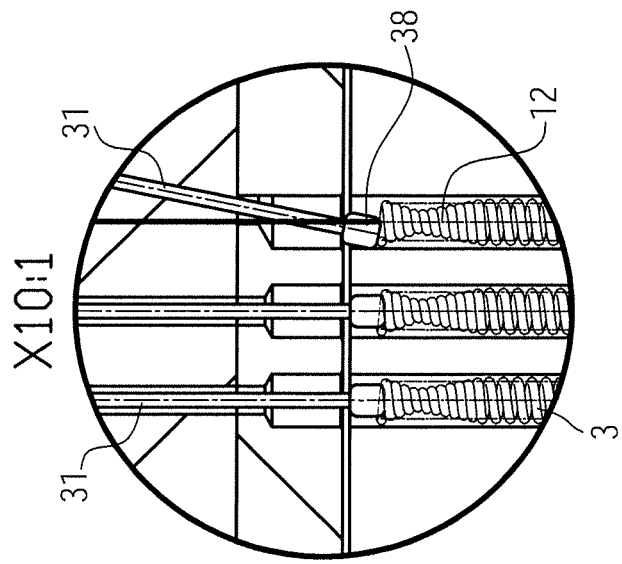
FIG. 3 shows a section of the contact region between contact needles of the adapter and spring contact pins of the full grid cassette.
Figure 1:
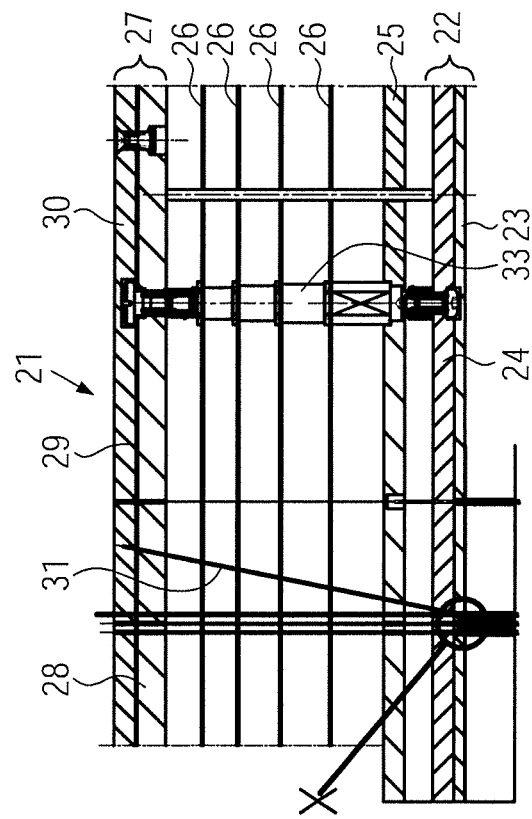
FIG. 1 is a sectional view of a region of an adapter together with an adjoining section of a full grid cassette.

A parallel tester comprises a plate-shaped basic grid element 1 (FIG. 2) with a plurality of contact points in the form of contact pads arranged in a regular grid pattern. Each of these contact points of the basic grid plate 1 is connected to a port of an electronic evaluation unit. The basic grid plate 1 supports a full grid cassette 2 with spring contact pins 3. The spring contact pins 3 of the full grid cassette 2 are arranged in the same grid pattern as the contact points of the basic grid plate, so that each contact point of the basic grid plate 1 touches and electrically contacts a spring contact pin 3. The spring contact pins 3 are arranged parallel to one another.

In the present embodiment, the full grid cassette 2 comprises a basic grid plate 4 and an adapter plate 5. The plates 4, 5 have a thickness of 7 mm. Through holes 6 with a constant cross-section are provided in the adapter plate 5 for accommodating a spring contact pin 3 each. The diameter of the through holes 6 is approximately 0.75 mm.

The basic grid plate 4 is likewise provided with through holes 7. These through holes 7 have an annular step 8, the diameter of the through holes 7 corresponding to the diameter of the through holes 6 of the adapter plate 5 in the section between the annular step 8 and the side of the basic grid plate 4 which faces the adapter plate 5 while being somewhat less, for example 0.6 mm, in the section from the annular step 8 to the side of the basic grid plate 4 which faces the basic grid plate 1.

Several guide devices 9 are arranged in the edge region of the two plates 4, 5. Each of the guide devices 9 comprises two cylindrical sleeves which are displaceable relative to one another and wherein a coil spring (not illustrated) is located. The guide devices 9 are non-positively and/or positively joined to the plates 4, 5. The corresponding holes in the basic grid plate 4 and the adapter plate 5 are arranged such that they resiliently push apart the two plates 4, 5 to some degree. If no external pressure acts on the full grid cassette 2, a distance of approximately 2 to 5 mm is created between the two plates 4, 5 by the guide devices 9. In this way, the guide devices 9 guide the two plates 4, 5, if loaded, in such a way that they are substantially moved towards one another in the axial direction 10 of the spring contact pins 3 only.

The guide devices 9 are however disposed on the two plates 4, 5 and designed such that there is a play between the basic grid plate 4 and the adapter plate 5 at right angles to the axial direction 10. The spring contact pins 3 are wound from a wire with a thickness of e.g. 0.12 mm. They comprise a spring section 11 extending along most of the length of the spring contact pins 3. In the spring section 11, the spring contact pins 3 are helically wound with adjacent windings being arranged at a distance from one another, so that these spring sections provide a resilient spring action.

At the end facing the adapter, the spring section 11 merges into a so-called trumpet section 12. The trumpet section 12 comprises a few windings without axial spacing. As a result, the trumpet section 12 is rigid. It has a taper which widens again towards the end. This creates a depression facing the adapter. This depression accommodates the ends of contact needles or contact pins of the adapter. This taper gives the trumpet section the shape of a trumpet and thus its name. The applicant identifies such spring contact pins with a trumpet section as "trumpet springs".

At the end remote from the trumpet section 12, the spring section 11 merges into a thickened section 13 with a few windings with a diameter larger than that of all the other windings of the spring contact pin 3.

The thickened section 13 is adjoined by a plug-in section 14 of the spring contact pin 3. The individual windings of the plug-in section 14 have a smaller diameter than those of the spring section 11 and are not spaced, so that the plug-in section 14 is rigid. At the end of the plug-in section 14 which faces the basic grid plate 1, the spring contact pin 3 has a slight taper, the last winding section being bent to a smaller radius than the adjacent windings, so that the end of the wire of the spring contact pin 3 is approximately central relative to the adjacent windings. This creates a central spring contact point 15 (FIG. 2, FIG. 8).

FIG. 8 is a top view of a section of a basic grid with contact pads 16. This basic grid comprises two interlaced square grids. Each square grid has a grid spacing of 50 mil. The two grids are offset relative to one another in the X- and Y-directions by half a grid spacing (=25 mil).

The contact point of conventional spring contact pins lies outside the centre of the spring contact pin on a circular line indicated diagrammatically in FIG. 8 as circular line 17. If the spring contact pin is not centred accurately relative to the contact pad, there is a risk that the spring contact pin may contact the basic grid element outside the contact point, whereby an electrical contact would be prevented. With an eccentric placing of the contact point, faulty contacting may be caused even at an offset which is only equal to the distance between the circular line 17 and the outer edge of the contact pad 16 (=Δs).

With a central placing of the spring contact point 15 of the spring contact pin 3, the spring contact pin 3, if perfectly aligned, contacts a contact pad 16 precisely in the centre. The tolerance band from which there is a risk of faulty contacting therefore covers the full radius R of the contact pad 16, being a multiple of the tolerance band Δs achieved by the accurate placing of conventional spring contact pins.

This is particularly advantageous if the basic grid is constructed from several modules 18. There are abutting edges 19 between the modules. In the region of the abutting edges 19 of the modules, the contact pads 16 are slightly cut for reasons of manufacturing technology, so that the tolerance band for an offset of the spring contact pins relative to the contact pads 16 is reduced even more. In the region of the abutting edges 19, the risk of faulty contacting with an eccentric contact point is increased significantly.

The contact pads shown in FIG. 8 have a diameter D of 0.635 mm or a radius of 0.317 mm. the optimum obtainable tolerance is therefore 0.317 mm. In conventional spring pins, the circular line 17 has a diameter of 0.4 mm (r=0.2 mm). This results in a tolerance band of only 0.117 mm. If the contact pads 16 are cur at the abutting edges, this is reduced to 0.06 mm.

A film 20 is placed in the region between the basic grid plate 4 and the adapter plate 5. This thin plastic film is provided with holes in the grid pattern of the spring contact pins 3. These holes are preferably slots, the length of which is approximately equal to or slightly exceeds the external diameter of the spring contact pins in the region of the spring section 11 and the width of which is slightly less than the maximum thickness of the spring contact pins.

As the spring contact pins are inserted into the full grid cassette, the holes in the film 20 are temporarily expanded elastically, in particular during the entry of the thickened section 13, and the longitudinal edges of the slot bend outwards. When the spring contact pin reaches its end position, the longitudinal edges snap back behind the thickened section and/or into the space between two windings. This secures the spring contact pin 3 against falling out of the full grid cassette. The weight of the spring contact pins 3 is in particular not sufficient to push them through the respective slot by their thickened section 13.

In the present embodiment, the film is made of polyimide (PI).

The basic grid plate 4 and the adapter plate 5 are made of a non-fibrous plastic material. This gives the through holes 6, 7 a smooth surface which facilitates the insertion of the spring contact pins. An example for a suitable plastic material is polyether ether ketone (PEEK). In the present embodiment, the plates 4, 5 have a thickness of 7 mm. A plate thickness of 5 to 10 mm is conceivable.

The electrical connection between the spring contact pins arranged in a regular grid pattern and the irregularly arranged contact points of a printed circuit board to be tested, which will hereinafter be referred to as printed circuit board test points, is established via an adapter 21. The adapter 21 is constructed from a plurality of guide plates arranged parallel to one another. Adjacent to the full grid cassette 2, a plate assembly with two plates is provided, which has holes matching the pattern of the spring contact pins of the full grid cassette or of the contact points of the basic grid respectively. This plate assembly will hereinafter be referred to as basic grid unit 22 or BG unit 22. The BG unit 22 comprises a cover plate 23 and a structural plate 24. The cover plate immediately adjoins the full grid cassette 2 and has a thickness of approximately 1.5 mm. The structural plate 24 is in contact with the cover plate 23. It has a thickness of 3 mm and provides the adapter with the necessary mechanical strength on the side facing the full grid cassette.

A retaining plate 25 is provided at a slight distance from the structural plate 24. The retaining plate has a thickness of 3 mm.

Four thin guide plates 26 are arranged at a distance from one another. Each has a thickness of 0.3 mm. On the side of the adapter 21 which faces the printed circuit board, an assembly of three plates is provided, which will hereinafter be referred to as printed circuit board unit or PCB unit 27. The PCB unit comprises a structural plate 28, a guide plate 29 and a cover plate 30. The structural plate 28 provides the PCB unit 27 with the necessary mechanical strength. This structural plate 28 has a thickness of 4 mm.

The cover plate 23 and the cover plate 30 are bolted to the other plates of the adapter outside the test area. These screw connections can therefore not affect the electrical properties of the adapter.

The guide plate 29 is once again a thin guide plate with a thickness of 0.3 mm. In such a thin plate, the holes for guiding the contact needles and contact pins can be produced more easily with a high precision than in the thicker structural and retaining plates. The guide plate 29 has a hole pattern which matches that of the printed circuit board test points and thereby ensures that the test needles of the adapter 21 are aligned accurately to the printed circuit board test points.

With the exception of the cover plates 23, 30, all plates are held at the required spacing by several known column mechanisms 33. Between the BG unit 22 and the PCB unit 27, alignment pins 34 are provided, each of which positively passes through a hole in the retaining plate 25 and in the guide plates 26, thereby precisely aligning the plates 25, 26.

The adapter 21 may be provided both with contact needles 31 and with contact pins 32 as test needles. The contact needles 31 are used for contacting pad arrays on the printed circuit board to be tested. The contact pins 32 are designed for contacting plated-through holes 37 of the printed circuit board 35.

The contact needles 31 may have different diameters. In the present embodiment, contact needles with a diameter of 0.15 mm and contact needles 31.2 with a diameter of 0.25 mm are provided. Each of these contact needles 31 has a circular cross-section. At the ends facing the full grid cassette, they are provided with a thickening 38. This thickening 38 may be produced either by means of a snap-on or shrunk-on sleeve 38.1 or by means of a crimping 38.2 of the contact needle 31.2. Crimping is easier and more cost-effective. It requires a certain material thickness of the contact needle, however, and is mainly suitable for thicker contact needles. Thinner contact needles are better fitted with an additional sleeve 38.1.

Stepped holes are provided in the cover plate 23 to accommodate the crimping 38.2 of the contact needles 31.2, and stepped holes are provided in the retaining plate 25 to accommodate the sleeves 38.1. These stepped holes prevent the thickening 38 of the contact needles 31 from passing through the plate 23, 25, thus securing them against falling out towards the side of the printed circuit board to be tested.

In principle, such contact needles 31 are capable of contacting edge regions of the plated-through holes 37 on the surface of the printed circuit board 35. Experience shows, however, that the offsets of pad arrays 36 and plated-through holes 37 are independent of one another owing to the different production processes used. This means that, as a rule, all pad arrays 36 have a defined offset relative to their ideal position by a predetermined amount and in a predetermined direction, while all plated-through holes have a different offset in a predetermined direction and by a predetermined amount. The contact needles 31 have to be aligned and adjusted very precisely to the small pad arrays 36.

The contact pins 32, which are specifically designed for plated-through holes 37, have a widened scanning head 39 at the end facing the printed circuit board 35. A triangular point of this scanning head 39 points towards the printed circuit board 35. This permits the secure contacting of the plated-through hole 37 even if the contact pins 32 are not aligned so precisely to the plated-through holes 37 as the contact needles 31 are aligned to the pad arrays 36. In this way, all printed circuit board test points 36, 37 can be contacted securely even if the adapter 21 is mainly aligned to the printed circuit board 35 with reference to the contact needles 31 and the corresponding pad arrays 36.

The contact pins 32 according to the present embodiment are made of thin sheet metal with a thickness of e.g. 0.2 mm. The scanning heads are likewise made of this sheet metal.

Figure 5:
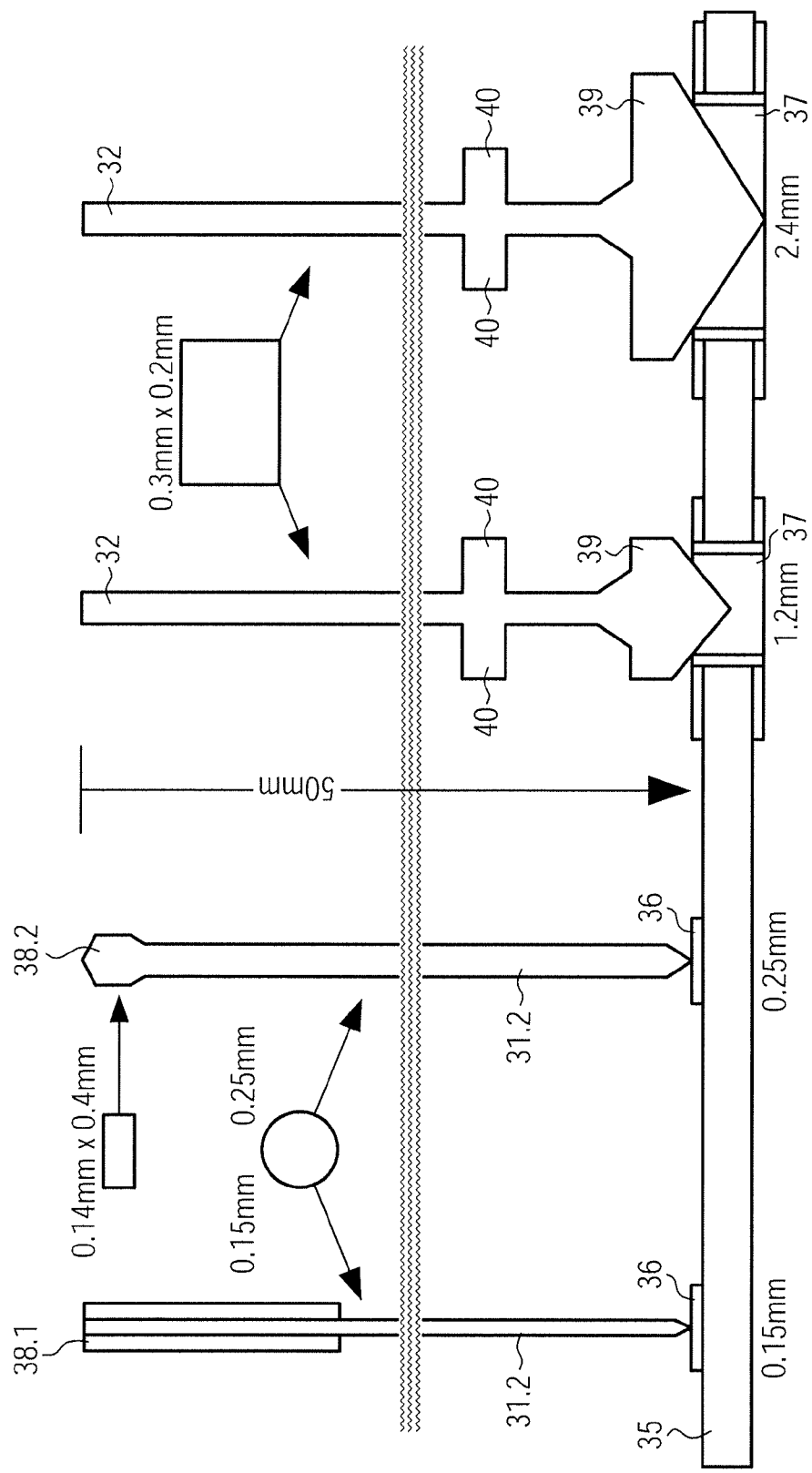
FIG. 5 is a diagrammatic representation of various contact needles and contact pins of the adapter together with a printed circuit board to be tested.

Locking projections 40 are provided on the contact pins 32 at a slight distance adjacent to the scanning heads 39 (FIG. 5, 6a).

Figure 6A:
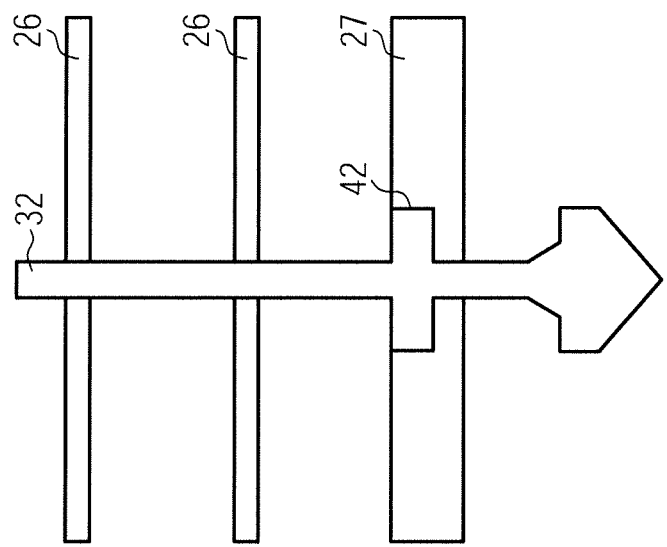
FIG. 6a is a diagrammatic representation of a contact pin of the adapter with a locking projection and some guide plates of the adapter.
Figure 6B:
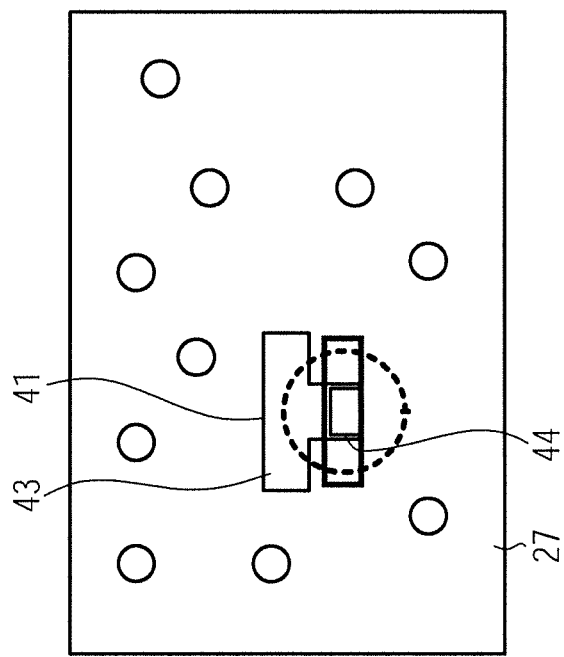

To accommodate the contact pins 32, special holes hereinafter referred to as keyholes 41 are provided in the PCB unit 27. These keyholes are large enough to allow the passage of the contact pin 32 together with its locking projection(s) 40. The keyhole 41 may be adjoined on the side of the PCB unit 27 which is remote from the printed circuit board by a recess 42 for the accommodation of the locking projection 40. In the embodiment shown in FIG. 6b, the keyhole 41 is T-shaped if viewed from above, so that the contact pin 32 together with its locking projection 40 can be guided through the "cross bar 43 of the T", whereupon it is displaced along the "upright 44 of the T" at the narrow section of the contact pin 32 in the region between the locking projection 40 and the scanning head 39. The recess 42 for the accommodation of the locking projection 40 adjoins the end of the upright 44 which is remote from the cross bar 43. The locking projection is installed into this recess 42, preventing the contact pin from moving back towards the cross bar 43 and from falling out of the adapter 21 on the side facing the printed circuit board.

The recess 40 is formed in the structural plate 28 of the PCB unit 27.

Within the scope of the invention, the keyhole 41 and the recess 42 may obviously have other shapes. The keyhole 41 may be designed as a slot, and the recess 42 may extend at right angles to the slot if viewed from above. In this case, the contact pin 32 will have to be rotated by 90° in the keyhole 41 following the insertion of the locking projection(s) 40, so that the locking projections 40 come to lie in the recess.

The keyhole 41 may alternatively be designed without a corresponding recess. The guide holes in the other guide plates 26 are arranged such that they guide the contact pin 32 through the keyhole 41 at a point which is so narrow that the locking projection(s) 40 come(s) to lie on the guide plate 27. In the T-shaped keyhole shown in FIG. 6b, this position, which is the ideal position of the contact pin 32, is located in the region of the upright 44. For insertion or removal, the contact pin 32 has to be bent to guide the locking projections 40 through the cross bar 43 of the T-shaped keyhole 41.

The contact pins 32 in the adapter 21 are oriented substantially perpendicular to the individual plates 23-30. The contact needles 31, on the other hand, are often inclined in the adapter 21. As a result, contact points of the printed circuit board to be tested which are not located in the grid can be contacted, and the ends of many contact needles 31 can be provided in locally limited regions on the side of the printed circuit board to be tested in order to obtain a high contact density. On the opposite side facing the full grid cassette 2, the ends of these contact needles are distributed over a much larger area in which they contact a plurality of spring contact pins 3. For this reason, it is desirable to incline the contact needles 31 as much as possible. In principle, there are no mechanical limits to the inclination of the contact needles 31. Any such inclination however shortens the contact needle 31 in the axial direction, this being the direction perpendicular to the plates 23-30. This length difference in the axial direction is compensated by the spring contact pins 3.

Figure 4A:
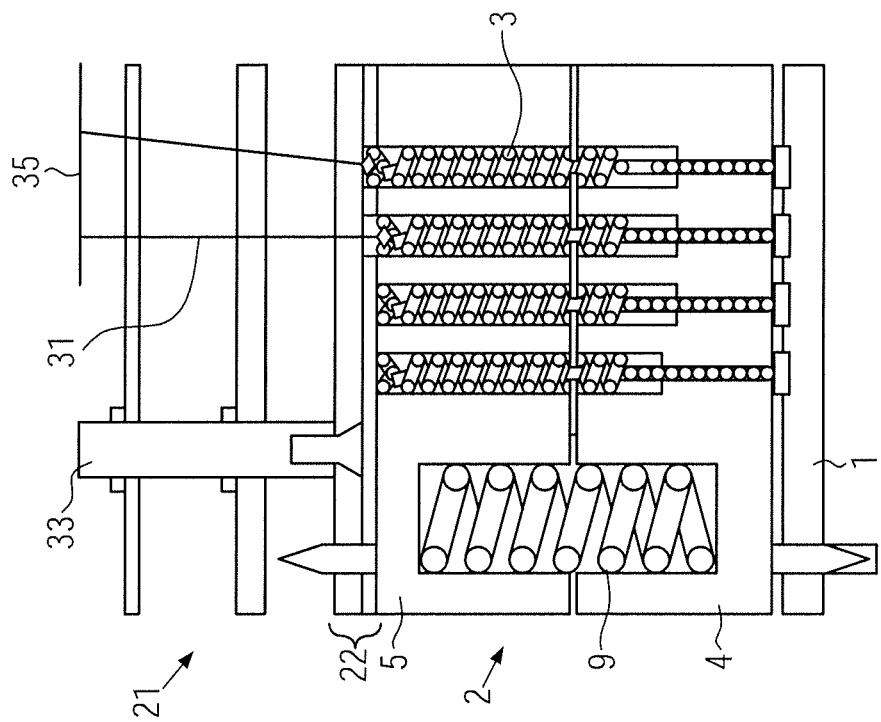
FIGS. 4a and 4b are diagrammatic sections through a region of the full grid cassette and an adapter in the unloaded state (FIG. 4a) and in the loaded state (FIG. 4b)

FIG. 4a is a highly diagrammatic and simplified representation of the full grid cassette 2 and the adapter 21 in the unloaded state. In this state, the basic grid plate 4 and the adapter plate 5 are pushed apart slightly by the guide device 9, and the spring contact pins 3 lie in the through holes 6, 7 in the released state. The basic grid plate 4 is fitted with several alignment pins 45 in engagement with alignment holes 46 of the basic grid element. Alignment pins 47 of the adapter plate 21 are in engagement with corresponding alignment holes 48 in the BG unit 22. The thickened sections of the contact needles 31 are accommodated in the depressions of the trumpet sections 12 of the spring contact pins 3. The inclined contact needles 31 are arranged at a distance from the printed circuit board to be tested.

Figure 4B:
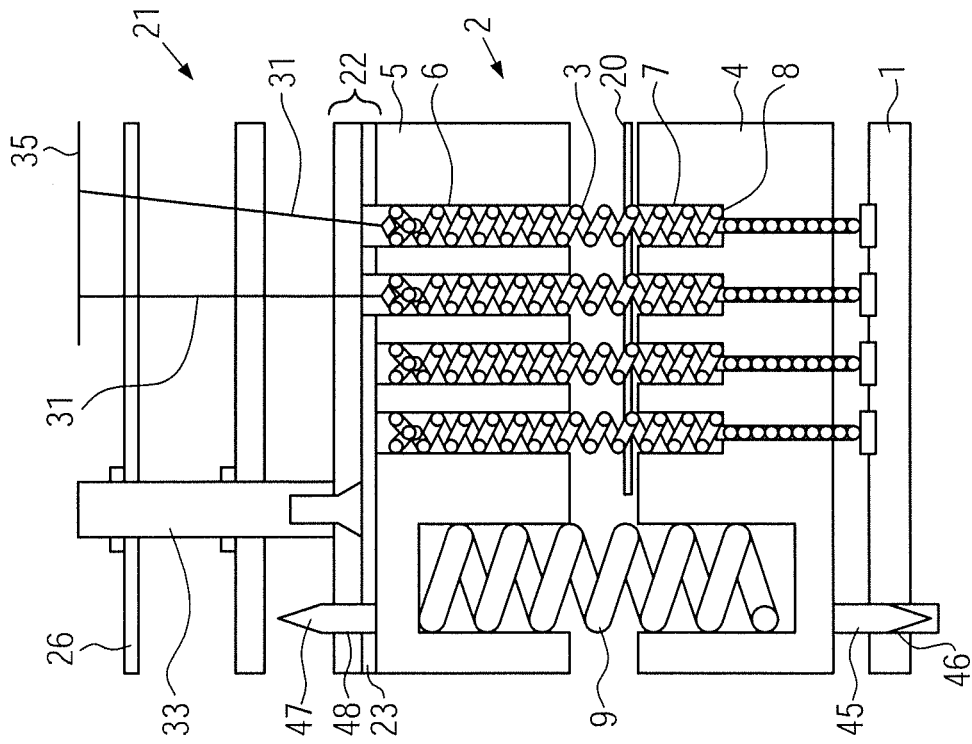

If this contact assembly is now loaded, i.e. compressed by a suitable press, the basic grid plate 4 and the adapter plate 5 are pushed together in the full grid cassette 2 against the spring action of the guide devices 9. This pushes the spring contact pins 3 towards the adapter 21. They are now spring-loaded against the contact needles 31. The contact needles 31 are then pushed towards the printed circuit board to be tested, so that all contact needles 31 contact the respective printed circuit board test points. FIG. 4b clearly illustrates the different levels of the contact points between contact needles and spring contact pins in inclined and non-inclined arrangements.

The spring contact pins 3 to which no contact needle 31 or contact pin 32 is assigned are pushed against the cover plate 23 of the adapter 21. In addition, the cover plate 23 covers the screw elements securing the column mechanisms 33 in the adapter 21. The cover plate 23 therefore ensures that there cannot be any unwanted contact between unused spring contact pins 3 and other elements of the adapter.

It should further be noted that the alignment pins 45 of the basic grid plate 4 and the alignment pins 47 of the adapter plate 5 are independent of one another, allowing the basic grid plate 4 and the adapter plate 5 to be independently aligned to the basic grid element 1 or the adapter 21 respectively. This independent alignment is further facilitated by the play between the basic grid plate 4 and the adapter plate 5. This play is on the one hand provided by the guide devices 9 and on the other hand by the fact that the spring contact pins 3 extend without a steel sleeve across the gap between the basic grid plate 4 and the adapter plate 5 and are therefore movable at right angles to their axial direction 10.

The invention can be summarised briefly as follows:

The invention relates to a full grid cassette for a parallel tester for testing a non-componented printed circuit board, to a spring contact pin for such a full grid cassette and to an adapter for a parallel tester for testing a non-componented printed circuit board.

According to a first aspect of the present invention, spring contact pins are secured in the full grid cassette by means of a film. According to a further aspect of the present invention, the full grid cassette comprises two plates which are movable relative to one another in the axial direction of the spring contact pins and have a play at right angles to the axial direction. According to a third aspect of the present invention, the spring contact pins are designed with a central spring contact point. According to a further aspect of the present invention, an adapter is provided with contact pins fitted with a scanning head, wherein the contact pins have a locking projection securing them against falling out on a guide plate of the adapter.

LIST OF REFERENCE NUMBERS

1 Basic grid element
2 Full grid cassette
3 Spring contact pin
4 Basic grid plate
5 Adapter plate
6 Through hole of adapter plate
7 Through hole of basic grid plate
8 Annular step
9 Guide device
10 Axial direction of the spring contact pins
11 Spring section
12 Trumpet section
13 Thickened section
14 Plug-in section 15 Central spring contact point
16 Contact pad of the basic grid
17 Circular line
18 Module
19 Abutting edge
20 Film
21 Adapter
22 BG unit
23 Cover plate
24 Structural plate
25 Retaining plate
26 Guide plate
27 PCB unit
28 Structural plate
29 Guide plate
30 Cover plate
31 Contact needle
32 Contact pin
33 Column mechanism
34 Alignment pin
35 Printed circuit board
36 Pad array
37 Plated-through hole
38 Thickening
39 Scanning head
40 Locking projection
41 Keyhole
42 Recess
43 Cross bar
44 Upright
45 Alignment pin
46 Alignment hole
47 Alignment pin
48 Alignment hole

The invention claimed is:

1. A full grid cassette for an apparatus for testing non-componented printed circuit boards, the full grid cassette electrically connects contact points of a basic grid to individual test needles of an adapter, wherein the full grid cassette comprises:
a basic grid plate oriented towards the basic grid and an adapter plate oriented towards the adapter, wherein aligned through holes in each of the basic grid plate and the adapter plate are provided to accommodate spring contact pins, each of the spring contact pins being made from a wire with a helically wound spring section and located without sheathing in the through holes of the adapter plate and of the basic grid plate and the spring sections extending at least across a region between the adapter plate and the basic grid plate; and
a film located between the adapter plate and the basic grid plate and provided with holes through each of which one of the spring contact pins passes, the width of the holes being less than the maximum diameter of the spring contact pins.

2. The full grid cassette according to claim 1, wherein the holes of the film are designed as slots, the length of which is approximately equal to or slightly exceeds the maximum diameter of the spring contact pins.

3. The full grid cassette according to claim 2, wherein the film is made of polyimide.

4. The full grid cassette according to claim 3, wherein the spring contact pins are made of spring wire.

5. The full grid cassette according to claim 4, wherein a taper is provided in the through holes of the basic grid plate or the adapter plate, the through hole tapering towards the outside of the full grid cassette, and in that the spring contact pins have a thickened section located between the taper and the film.

6. The full grid cassette according to claim 5, wherein the taper is configured as an annular step.

7. The full grid cassette according to claim 1, wherein the film is made of polyimide.

8. The full grid cassette according to claim 1, wherein the spring contact pins are made of spring wire.

9. The full grid cassette according to claim 1, wherein a taper is provided in the through holes of the basic grid plate or the adapter plate, the through hole tapering towards the outside of the full grid cassette, and in that the spring contact pins have a thickened section located between the taper and the film.

10. The full grid cassette according to claim 9, wherein the taper is configured as an annular step.

11. The full grid cassette according to claim 1, wherein the spring section of the spring contact pins extends across a region between the adapter plate and the basic grid plate.

12. The full grid cassette according to claim 1, wherein the spring contact pins are arranged in a regular grid pattern corresponding to the basic grid.

13. The full grid cassette according to claim 1, wherein the test needles of the adapter comprise contact needles and/or contact pins.

14. A unit comprising a full grid cassette according to claim 1 and an adapter for an apparatus for testing non-componented printed circuit boards, wherein the adapter being designed for electrically connecting contact pins of a full grid cassette with contact points of a printed circuit board, wherein the adapter comprises test needles which are secured from dropping out on just one side of the adapter, and the full grid, cassette is attached on the side of the adapter on which the test needles are not secured.

15. The unit according to claim 14, wherein the adapter comprises contact needles or contact pins as well as a plurality of guide plates, wherein guide holes are formed through which the contact needles or the contact pins pass, wherein the contact needles or contact pins are designed for contacting plated-through holes of the printed circuit boards to be tested with a scanning head which is significantly wider than the rest of the contact needles or contact pins, and wherein the contact needles or contact pins have a locking projection and the guide plate of the adapter which faces the printed circuit board to be tested has a keyhole designed such that the locking projection can be passed through from the side of the printed circuit board to be tested, and wherein, on the side remote from the printed circuit board to be tested, either a locking recess is provided adjacent to the keyhole for the accommodation of the locking projection, or the keyhole has a region through which the locking projection can be passed and which is slightly offset from an ideal position of the contact needles or contact pins and has a narrower region which extends to the ideal position, so that the contact needles or contact pins adopt its ideal position guided by the further guide plates and the locking projection comes to lie on the guide plate provided with the keyhole.

16. A full grid cassette for an apparatus for testing non-componented printed circuit boards, the full grid cassette electrically connects contact points of a basic grid to individual test needles of an adapter, wherein the full grid comprises:
a basic grid plate oriented towards the basic grid and an adapter plate oriented towards the adapter, wherein aligned through holes are provided to accommodate and guide spring contact pins, each of the spring contact pins being made from a wire with a helically wound spring section and located without sheathing in the through holes of the adapter plate and of the basic grid plate; and a guide device located between the adapter plate and the basic grid plate such that the adapter plate and the basic grid plate are movable relative to one another in an axial direction of the spring contact pins and have play in a plane perpendicular to the axial direction of the spring contact pins.

17. The full grid cassette according to claim 16, wherein the play lies within a range of 60 µm to 200 µm, preferably 80 µm to 150 µm.

18. The full grid cassette according to claim 16, wherein the spring section of the spring contact pins extends across a region between the adapter plate and the basic grid plate.

19. The full grid cassette according to claim 16, wherein the spring contact pins are arranged in a regular grid pattern corresponding to the basic grid.

20. The full grid cassette according to claim 16, wherein the test needles of the adapter comprise contact needles and/or contact pins.

21. A unit comprising a full grid cassette according to claim 16 and an adapter for an apparatus for testing non-componented printed circuit boards, wherein the adapter is designed for electrically connecting contact pins of a full grid cassette with contact points of a printed circuit board, wherein the adapter comprises test needles which are secured from dropping out on just one side of the adapter, and the full grid cassette is attached on the side of the adapter on which the test needles are not secured.

22. The unit according to claim 21, wherein the adapter comprises contact needles or contact pins as well as a plurality of guide plates, wherein guide holes are formed through which the contact needles or the contact pins pass, wherein the contact needles or contact pins are designed for contacting plated-through holes of the printed circuit boards to be tested with a scanning head which is significantly wider than the rest of the contact needles or contact pins, and wherein the contact needles or contact pins have a locking projection and the guide plate of the adapter which faces the printed circuit board to be tested has a keyhole designed such that the locking projection can be passed through from the side of the printed circuit board to be tested, and wherein, on the side remote from the printed circuit board to be tested, either a locking recess is provided adjacent to the keyhole for the accommodation of the locking projection, or the keyhole has a region through which the locking projection can be passed and which is slightly offset from an ideal position of the contact needles or contact pins and has a narrower region which extends to the ideal position, so that the contact needles and contact pins adopt its ideal position guided by the further guide plates and the locking projection comes to lie on the guide plate provided with the keyhole.

23. The unit according to claim 22, wherein the adapter is provided both with contact needles and with contact pins.

24. The unit according to claim 22, wherein the contact pins are made of thin sheet metal.

25. A contact pin for a full grid cassette comprising:
a spring contact pin helically wound from a wire having at least one spring section,
wherein a maximum diameter of the spring contact pin is no more than 0.8 mm and an end winding is wound to a smaller radius than adjacent windings, so that the wire has an end which is disposed centrally relative to the adjacent windings and forms a central contact point.

26. The spring contact pin according to claim 25, wherein the wire is a spring wire.

27. The spring contact pin according to claim 25, wherein the wire has a diameter approximately 0.10 mm to 0.15 mm.

28. The spring contact pin according to claim 27, wherein the diameter is approximately 0.10 mm to 0.12 mm.

29. An apparatus for testing non-componented printed circuit boards comprising:
an adapter electrically connecting spring contact pins of a full grid cassette to contact points of a printed circuit board to be tested,
wherein the adapter is provided with a plurality of guide plates,
wherein guide holes are formed through the plurality of guide plates which a plurality of contact pins pass,
wherein the contact pins contact plated-through holes of the printed circuit boards to be tested with a scanning head which is wider than the rest of the contact pin,
wherein the contact pin has a locking projection and the guide plate of the adapter which faces the printed circuit board to be tested has a keyhole configured such that the locking projection can be passed through from a side of the printed circuit board to be tested, and
wherein on the side remote from the printed circuit board to be tested, either a locking recess is provided adjacent to the keyhole for the accommodation of the locking projection, or the keyhole has a region through which the locking projection can be passed and which is offset from an ideal position of the contact pin and has a narrower region which extends to the ideal position, so that the contact pin adopts a position guided by the further guide plates and the locking projection comes to lie on the guide plate provided with the keyhole.

30. The adapter according to claim 29, wherein the adapter has both contact needles and contact pins.

31. The adapter according to claim 30, wherein the contact pins are made of thin sheet metal.

32. The adapter according to claim 29, wherein the contact pins are made of thin sheet metal.

\* \* \* \* \*